United States Patent [19]
Dahringer et al.

[11] Patent Number: 5,741,430
[45] Date of Patent: Apr. 21, 1998

[54] CONDUCTIVE ADHESIVE BONDING MEANS

[75] Inventors: Donald William Dahringer, Glen Ridge; Alan Michael Lyons, New Providence, both of N.J.

[73] Assignee: Lucent Technologies Inc., Murray Hill, N.J.

[21] Appl. No.: 638,003

[22] Filed: Apr. 25, 1996

[51] Int. Cl.$^6$ ............................................. B44C 1/22
[52] U.S. Cl. ...................................... 216/34; 216/20
[58] Field of Search ......................... 216/33, 34, 100, 216/108, 103, 13, 18, 20, 52

[56] References Cited

U.S. PATENT DOCUMENTS

| | | | |
|---|---|---|---|
| 3,193,424 | 7/1965 | Scott | 156/73 |
| 4,212,701 | 7/1980 | Russel et al. | 156/665 |
| 4,554,033 | 11/1985 | Dery et al. | 156/52 |
| 4,588,456 | 5/1986 | Dery et al. | 156/52 |
| 4,640,981 | 2/1987 | Dery et al. | 174/88 R |
| 4,642,421 | 2/1987 | Dery et al. | 174/88 R |
| 4,659,872 | 4/1987 | Dery et al. | 174/117 A |
| 4,667,401 | 5/1987 | Clements et al. | 29/832 |
| 4,720,740 | 1/1988 | Clements et al. | 357/72 |
| 4,729,809 | 3/1988 | Dery et al. | 156/306.6 |
| 4,814,040 | 3/1989 | Ozawa | 156/634 |
| 4,868,637 | 9/1989 | Clements et al. | 357/72 |
| 4,948,457 | 8/1990 | Cooper et al. | 156/629 |
| 5,068,714 | 11/1991 | Seipier | 357/80 |
| 5,180,523 | 1/1993 | Durand et al. | 252/512 |
| 5,180,888 | 1/1993 | Sugiyama et al. | 174/94 R |
| 5,258,577 | 11/1993 | Clements | 174/88 R |
| 5,308,429 | 5/1994 | Bradley | 156/306.6 |
| 5,312,520 | 5/1994 | Chung | 134/7 |
| 5,328,087 | 7/1994 | Nelson et al. | 228/175 |
| 5,428,190 | 6/1995 | Stopperan | 174/261 |
| 5,438,223 | 8/1995 | Higashi et al. | 257/774 |
| 5,463,190 | 10/1995 | Carson et al. | 174/259 |
| 5,478,007 | 12/1995 | Marrs | 228/180.22 |

*Primary Examiner*—William Powell

[57] ABSTRACT

A method of electrically and mechanically bonding conductive surfaces with conductive adhesives, wherein at least one of the conductive surfaces is of the type upon which unstable oxides readily form. The conductive adhesives having a predetermined amount of conductive particles. The conductive particles having a rigidity at least as hard as the materials composing the conductive surfaces and any oxide formed thereon. The bonding method including the step of preparing the conductive surfaces so that a microscopically roughened oxide surface is formed thereon. The method further including the step of simultaneously applying a predetermined amount of heat and pressure to cure the conductive surface-conductive adhesive-conductive surface joint such that the conductive particles in the conductive adhesive pierce through the oxide to make direct contact with the conductive surfaces thereunder. The method controls the mechanical strength of the bond and the electrical characteristics of the bond joint. The electrical characteristics include joint resistivity and joint sensitivity to elevated temperature and/or humidity conditions.

31 Claims, 6 Drawing Sheets

CONDUCTIVE ADHESIVE BONDING MEANS

FIELD OF THE INVENTION

The present invention relates to conductive adhesives, and more particularly to a bonding means for electrically and mechanically connecting conductive surfaces using a conductive adhesive.

BACKGROUND OF THE INVENTION

In many electrical applications, it is desirable to electrically and mechanically interconnect two devices. For example, in the Autoplex Series II wireless base station a linear amplifier module (LAM) is assembled by fastening a printing wiring board (PWB) to an aluminum heat sink with numerous screws. The screws provide a mechanical connection between the PWB and the heat sink, as well as a means for electrically interconnecting the conductive surfaces of each device. Due to the high labor costs required for assembly and the large board area devoted to the screws, however, this method of fastening the PWB to the heat sink is not desirable for many applications.

Recently, alternative methods for bonding a PWB to a heat sink were introduced. One method involves bonding the conductive surface of the PWB to the conductive surface of an aluminum heat sink with an isotropically conductive adhesive (ICA). Basically, such ICA bonding methods involve pressing ICA paste between the conductive surfaces to form an electrical and mechanical bond therebetween. The resulting ICA bond or bonding joint provides a strong mechanical bond without any screws or extra fasteners. As a result, the ICA bonding method reduces the amount of board space devoted to the attachment, and thus is desirable for many applications.

The present-day ICA bonding methods, however, are not well suited for many applications wherein the bonding joint is exposed to conditions of elevated temperature and humidity, such as 85° C./85% relative humidity (hereinafter referred to as 85/85), for extended periods of time. The problem is that such present day bonding methods create a bonding joint that provides a substantially high electrical resistance between the conductive surfaces (i.e. approximately 600 micro-ohms), wherein the high joint resistance tends to increase even higher when exposed to such 85/85 conditions.

Moreover, such present day bonding methods are not well suited for bonding two conductive surfaces, wherein at least one conductive surface is composed of a material upon which unstable oxides form. Such materials include aluminum, copper, titanium, steel, and their alloys. One problem is that such oxides insulate conduction, and thus have an adverse affect on electrical resistance of the bonding joint between the two conductive surfaces. In fact, the thicker the layer of oxide, the higher the electrical resistance of the joint. A second problem is that the unstable oxide may increase in thickness, especially upon exposure to 85/85. A third problem is that many of these unstable oxide layers are weakly bonded to the underlying metal. Thus, the strength of adhesively bonded joints to these surfaces will be limited by the strength of the metal-metal oxide bond. As a result, since present day ICA bonding methods fail to address the problems associated with bonding such conductive surfaces, they are not desirable for applications requiring such a bond.

It should be noted, however, that in many cases a stable oxide layer is intentionally formed on such conductive metal surfaces to improve adhesion or the mechanical strength of an adhesive bond. More specifically, the thicker the stable oxide layer, the more stable the mechanical bond (i.e. when subjected to accelerated 85/85 conditions). As a result, when using a conductive adhesive to bond a conductive surface to a target surface, there is a tradeoff between the mechanical strength and the electrical resistance of the bonding joint formed therebetween. Thus, the failure of present day bonding methods to consider this tradeoff is further grounds for making the methods undesirable for applications requiring a low joint resistance and a strong mechanical bond between a conductive surface and a target surface, under adverse temperature and/or humidity conditions.

The significance of oxide formation on conductive surfaces, however, was recognized in U.S. Pat. No. 4,814,040, issued to Ozawa on Mar. 21, 1989 (hereinafter Ozawa). Ozawa recognized that aluminum and copper easily form unstable oxides, and that when bonding conductive surfaces made of such materials with a conductive adhesive, some treatment is required to prevent the harmful effects of the oxidation. Ozawa's treatment includes printing a conductive resist on the conductive surface and then printing a conductive adhesive thereover. However, Ozawa's process requires complex printing steps and only inhibits the conductive surface from oxidizing further.

The problems associated with bonding an oxidizable conductive surface to a target surface were also discussed in U.S. Pat. No. 5,180,523 issued to Durand et al. on Jan. 19, 1993 (hereinafter Durand). Durand describes a method of using special adhesives to bond metal surfaces, whereby the bonds exhibit low resistance under high humidity conditions. Durand recognized that the oxide layer on the conductive metal surface degrades the joint resistance because the oxide layer prevents the conductive particles from making contact with the metal conductive surface underneath the oxide layer. Moreover, Durand recognized that when exposed to elevated temperature and/or humidity, the oxide layer would grow, and thus increase the electrical resistance of the bonding joint.

To overcome this problem, Durand employed a bonding method that utilized a specially designed conductive adhesive composed of a combination of materials that exhibit a special property when cured. More specifically, the conductive adhesive included a combination of three types of conductive particles and a combination of epoxy resins that, upon curing, exhibit volumetric shrinkage. That is, the adhesive composition was such that, when cured, the epoxy would shrink and force the conductive particles through the oxide layer to make contact with the oxidizable conductive surface thereunder. As a result, the Durand bonding method depends solely on the force of the epoxy shrinkage to force the conductive particles through the oxide layer to make contact with the conductive surface thereunder.

Due to the substantially weak force of such epoxy shrinkage, however, application of the Durand method is severely limited. That is, the Durand bonding method only provides a bonding joint having improved electrical characteristics for oxidizable metals upon which only specific types of oxides form. Moreover, the Durand method can become quite limiting in that it is beneficial over the prior art only when using a conductive adhesive that has the specific mixture of conductive particles and epoxy resins.

SUMMARY OF THE INVENTION

Accordingly, the present invention is directed to an improved method of electrically and mechanically bonding a conductive surface to a target surface using conductive adhesives so that the bonding joint has a substantially low and stable joint resistance and a substantially strong mechanical bond under conditions of elevated temperature and/or humidity. The conductive surface is made of a material that forms an unstable oxide in an oxygen containing atmosphere. To attain the desired bonding joint, the present invention implements a pre-bonding surface preparation technique and a conductive adhesive composition that provides the flexibility needed to utilize the inventive bonding methods to bond any oxidizable conductive surface upon which unstable oxides form.

The conductive materials on which unstable oxides form include aluminum, copper, titanium, steel, and their alloys. According to the inventive method, the conductive surfaces are prepared such that a substantially stable microscopically rough layer is formed thereon. The surface preparation is accomplished by either causing a rough, stable oxide to form on the conductive material surface or by mechanically roughening the conductive surface. In the embodiment in which mechanical roughening is used, any oxide on the conductive surface is removed as the conductive surface is roughened. A new oxide layer forms on the roughened surface thereafter. A good mechanical bonding joint forms between the conductive adhesive and the conductive surface roughened by either technique.

The pre-bonding preparation of the target surface, however, depends on the type of material comprising the target surface. That is, if the target material oxidizes in an oxygen-containing containing environment, then the preparation depends on whether the oxide is stable or unstable. If the formed oxide is stable, the surface is cleaned prior to the bonding step. If the formed oxide is unstable, the surface is prepared such that a substantially stable, microscopically rough surface forms thereon prior to the bonding step. The microscopically rough surface provides the advantages previously described. If the target material does not oxidize in an oxygen containing environment (e.g. a material such as gold), then dirt and grease are removed from the surface to provide a clean bonding surface.

If the target material is copper, the target surface is prepared in the manner described for materials that form unstable oxides. However, if the copper surface is treated with an organic soldering preservative (OSP), typically an imidazole compound, the treated surface is clean and non-oxidizing. If the target surface is treated copper, then the surface is prepared in the manner described for preparing surfaces, such as gold, which do not oxidize in air.

To form the bonding joint, a conductive adhesive is sandwiched between the roughened conductive surface and the prepared target surface to form a stack. The conductive adhesive has a predetermined number of conductive particles which have a hardness at least as hard as the oxide layer on the conductive surface and the target surface (if any oxide thereon), as well as the material underlying the oxide. To complete the bond, a predetermined amount of heat and pressure is simultaneously applied to the stack so that the conductive particles of the adhesive penetrate through the microscopically rough surface and any oxide layer on the prepared target surface to make clean contact with the material underlying the oxide. A strong mechanical joint having a substantially low initial resistance and low sensitivity to extended periods of elevated temperature and/or humidity results.

In one embodiment, an aluminum heat sink is electrically and mechanically bonded to a tin-plated PWB (as in the Autoplex II cited above). When exposed to an oxygen-containing atmosphere, an unstable oxide forms on aluminum and a stable oxide forms on tin. The surface of the aluminum heat sink is roughened using either of the techniques previously described. The tin target surface is prepared so that all resident oxides and salts that remain after PWB manufacture are cleaned and neutralized. The surface cleaning can be performed by any means utilized in the art, as long as a stable oxide layer forms on the target surface, wherein the oxide layer has a predetermined thickness and hardness.

To form the bond, the conductive adhesive having conductive particles with the appropriate hardness, as described above, is sandwiched between the two prepared surfaces so that a stack forms. Examples of a material with an appropriate hardness include silver plated nickel, silver plated glass, silver plated copper, pure silver, and pure nickel. It is advantageous if the concentration of the metal in the conductive adhesive is about 5 volume percent to about 30 volume percent. The stack is then simultaneously subjected to a predetermined amount of pressure and heat so that the conductive particles penetrate the prepared surfaces and make direct contact with the underlying metal surfaces.

These and other features of the invention are described in more complete detail in the following detailed description on the invention when taken with the drawings. The scope of the invention, however, is limited only by the claims appended hereto.

DETAILED DESCRIPTION OF THE INVENTION

As described above, the present invention is directed to a method of bonding a conductive surface to a target surface so that the bonding joint has a predetermined mechanical bonding strength and a low joint resistance that is insensitive to adverse temperature and/or humidity conditions. The conductive surface is made of a material on which an unstable oxide forms when placed in an oxygen-containing atmosphere. The method utilizes surface preparation techniques to prepare both the conductive surface and the target surface so that a predetermined bonding strength is provided. In addition, the method uses a conductive adhesive to form the mechanical and electrical bond between the conductive surface and the target surface. The conductive adhesive has a predetermined amount of conductive particles, wherein the conductive particles are at least as hard as the conductive surface and the target surface, and any oxide formed on these surfaces.

Figure 1:
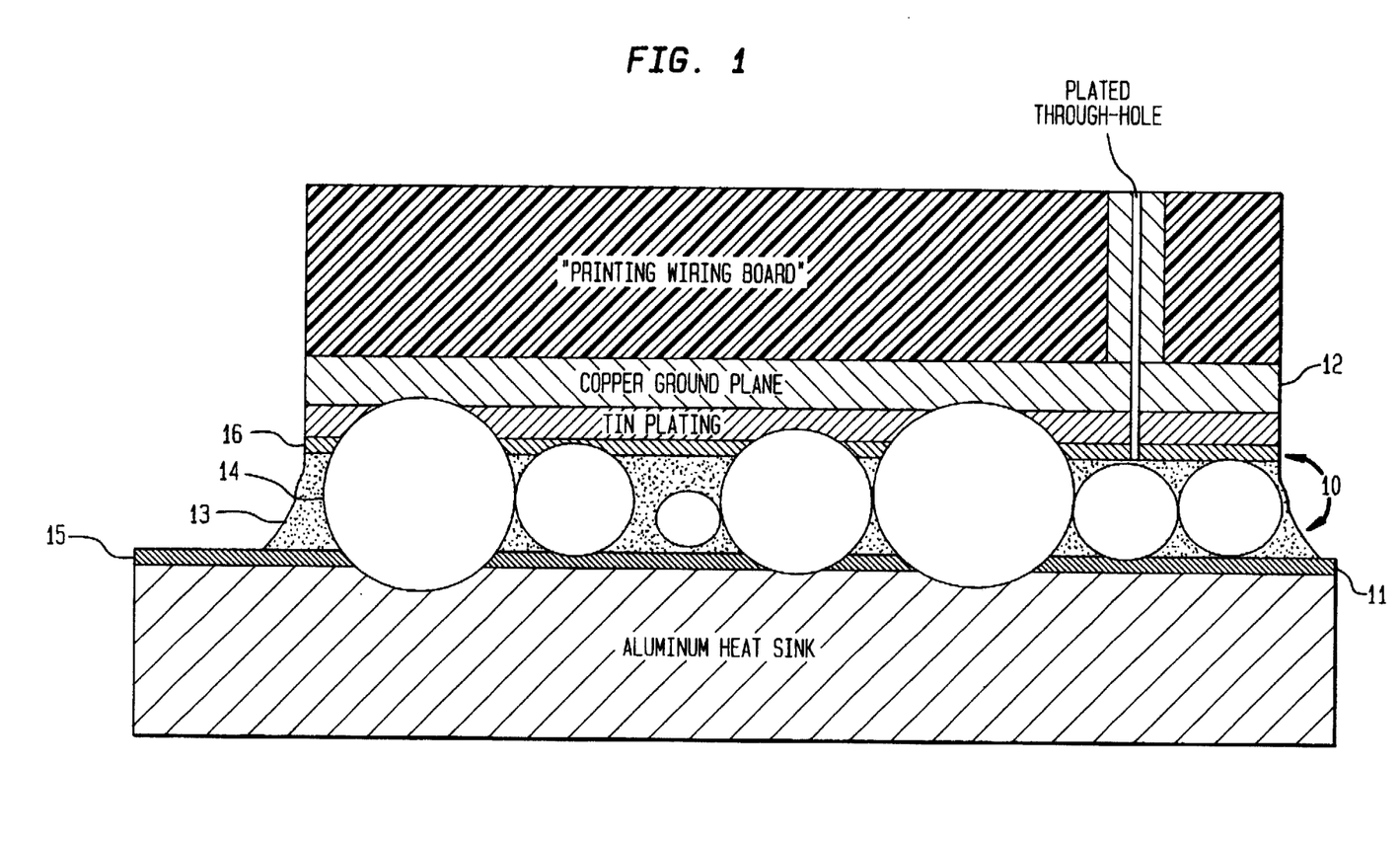
FIG. 1 shows a cross-sectional view of a bonding joint formed by the method of the present invention.

Referring now to FIG. 1, there is shown a conductive adhesive 13 that forms a bonding joint 10 between conductive surface 11 and a target surface 12. As shown, conductive surface 11 has an oxide layer 15 formed thereon, and target surface 12 also has oxide layer 16 formed thereon. The conductive particles 14 of adhesive 13 pierce through the oxide layers 15 and 16 to make direct contact with respective conductive surfaces 11 and 12 thereunder. The direct contact between particles 14 and surfaces 11 and 12 substantially reduces the joint resistance and the joint resistance sensitivity due to electrically insulating oxide layers 15 and 16. Also, oxide layers 15 and 16 have a topography and thickness that insures a substantially strong mechanical bond for joint 10.

For example, to form a bond between an aluminum surface 11 and a target tin surface 12, the aluminum surface 11 is treated with an etch based on $Na_2Cr_2O_7$—$H_2SO_4$ so that a stable, microscopically rough oxide layer 15 is formed thereon. Tin surface 12 is treated to provide a clean oxide layer 16 having the predetermined thickness. One method of cleaning a target surface upon which stable oxides form (e.g. a tin surface) includes the steps of: (1) immersing the surface in MacDermid PD-510 at 39° C. for 5 minutes; (2) rinsing the surface in distilled water for 5 minutes; (3) removing residual water by blowing the surface with clean nitrogen gas; and (3) drying the surface at 39° C. for 10 minutes. During this process, an oxide layer is allowed to naturally form on the clean tin-plated surface.

To form bonding joint 10 between surfaces 11 and 12, a conductive adhesive 13 having conductive particles 14 that are at least as hard as the oxide layers 15 and 16 is placed between layers 15 and 16 to form a stack. The stack is then simultaneously subjected to heat and pressure (e.g. 170° C. and 100 psi) to cure adhesive 13 such that conductive particles 14 pierce through oxide layers 15 and 16 and make direct contact with surfaces 11 and 12 thereunder.

Although the application of heat and pressure forces the particles through the oxide layers, if the adhesive is composed of particles having a distribution of sizes, only some fraction of the particles will be sufficiently large to penetrate both oxide surfaces at a given pressure. That is, at any given pressure, only a fraction of the conductive particles will provide a robust metal to metal electrical contact. As a result, increasing the applied pressure will increase the fraction of particles that are able to penetrate the oxide surfaces, thus lowering the bond or joint resistance. Thus, by adjusting the heat and pressure and setting the oxide thickness and hardness, the inventive method provides the flexibility to bond any oxidizable conductive surface to any target surface so that a bonding joint, having a predetermined mechanical bonding strength and low electrical resistivity, is formed. Thus, overcoming the limitations of the prior art.

It should be noted that the characteristics of the bonding joint can also be controlled by adjusting the size and/or shape of the conductive particles of the conductive adhesive. To illustrate, conductive adhesives having particles with rough surfaces will penetrate oxide layers more effectively than those having smooth spherical particles as the applied bonding pressure is forced over a smaller area. As a result, the adhesives having rough particles tend to provide better electrical conduction through the bonding joint than those with smooth particles. In addition, adhesives having single particles that span the bonding joint between the conductive surface and the target surface tend to provide better electrical conduction through the joint than those forming multi-particle bridges. Moreover, adhesives having soft particles tend to exhibit poor electrical characteristics by decreasing the ability of the particles to penetrate the oxide layer (if any) formed on the conductive surfaces. As a result, one can easily see that the joint bonding strength and the joint resistivity can be selectively controlled by the size, shape and hardness of the conductive particles that compose the conductive adhesive, and by the surface preparation method used to form the oxide layers on the conductive surfaces to be bonded.

Figure 2:
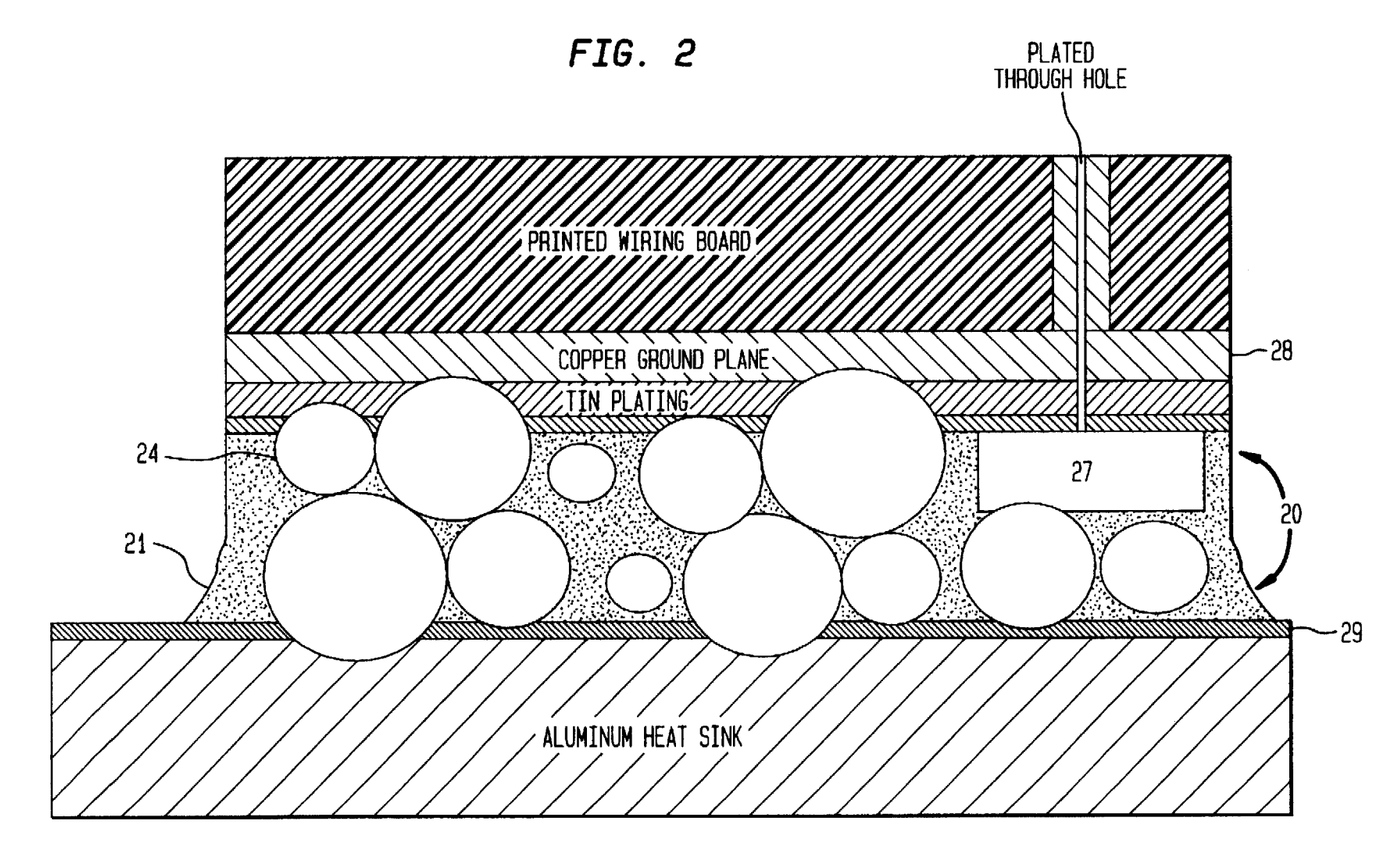
FIG. 2 shows a cross-sectional view of the behavior of the conductive particles for a bonding joint formed when a solder mask is used to prevent adhesive bleeding.

An illustration of a bonding joint wherein multi-particle bridges are formed is shown in FIG. 2; As shown, joint 20 electrically and mechanically bonds conductive surfaces 28 and 29 using conductive adhesive 21. Conductive surface 28, however, has a solder mask 27 deposited thereon. The mask causes particles to get trapped and act as standoffs, thus preventing the conductive particles 24 from forming single particle electrical bridges between the conductive surfaces 28 and 29 throughout the bonding joint 20. As a result, to bridge the gap the concentration of particles must be sufficiently large to enable agglomerates or multi-particle electrical paths to form between the conductive surfaces 28 and 29. These additional particles in the electrical path between surfaces 28 and 29 creates additional interfaces to achieve penetration through the oxide layers, and thus causes the joint resistance to increase.

Figure 3:
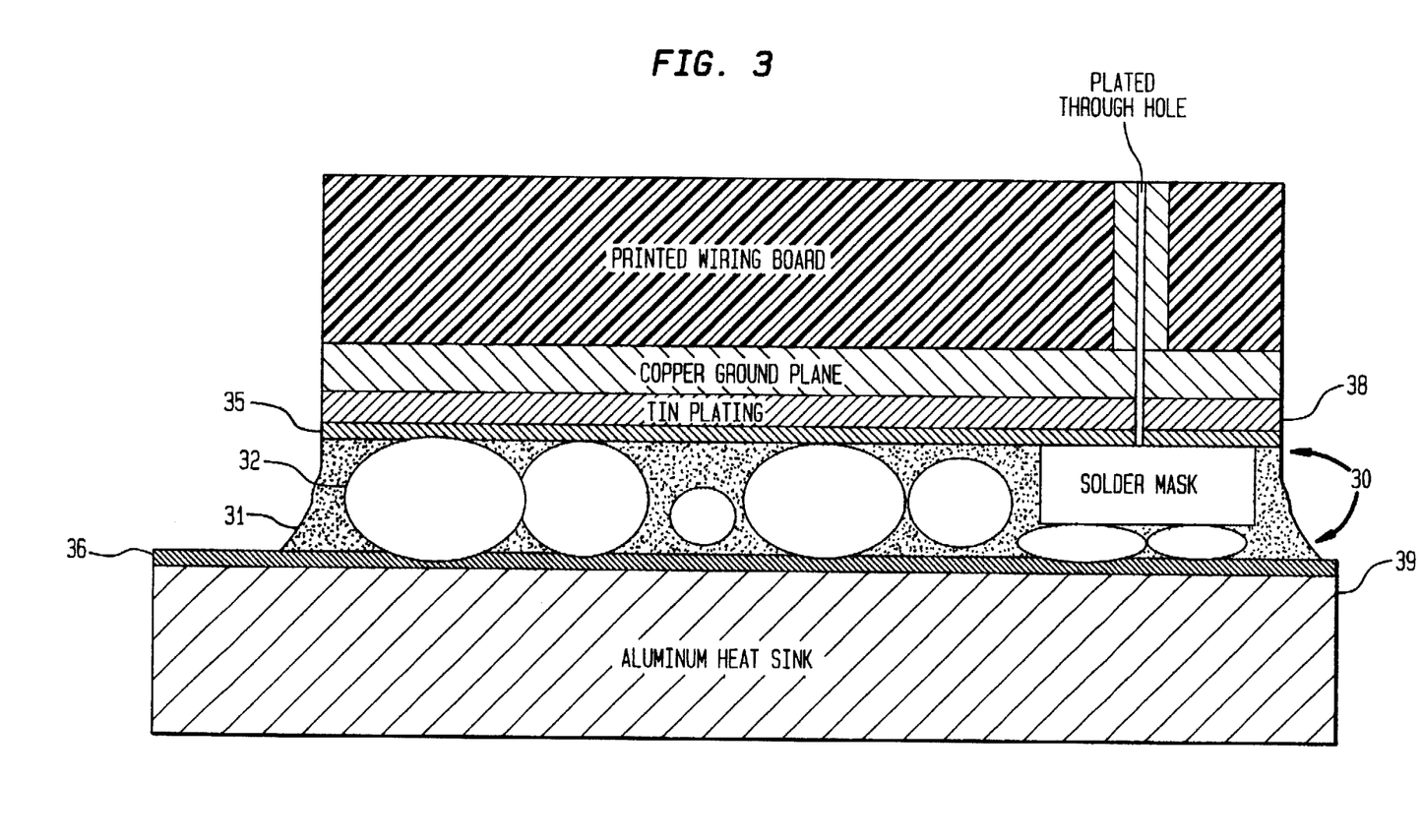
FIG. 3 shows a cross-sectional view of the conductive particles for a bonding joint formed with a conductive adhesive having conductive particles that are relatively softer than the hardness of the oxide layer formed on the conductive surface.

An illustration of a bonding joint wherein the particles have inadequate hardness that degrades the electrical characteristics of the bonding joint is shown in FIG. 3. As shown, joint 30 electrically and mechanically bonds conductive surfaces 38 and 39 using conductive adhesive 31. Conductive adhesive 31, however, has conductive particles 32 that are not as hard as the oxide layers 35 and 36 formed on surfaces 38 and 39, respectively. As a result, when put under pressure, the soft particles deform and flatten. That is, particles 32 do not penetrate oxide layers 35 and 36, and thus do not provide a low resistance bonding joint as provided by the method of the present invention. In fact, the resistance of such a joint is typically significantly higher and more sensitive to heat and humidity exposure than a joint having multi-particle bridges, as shown in FIG. 2. The key factor in lowering the joint resistance is having particles that are rigid enough to penetrate through any oxide layers on the conductive surfaces.

Figure 4:
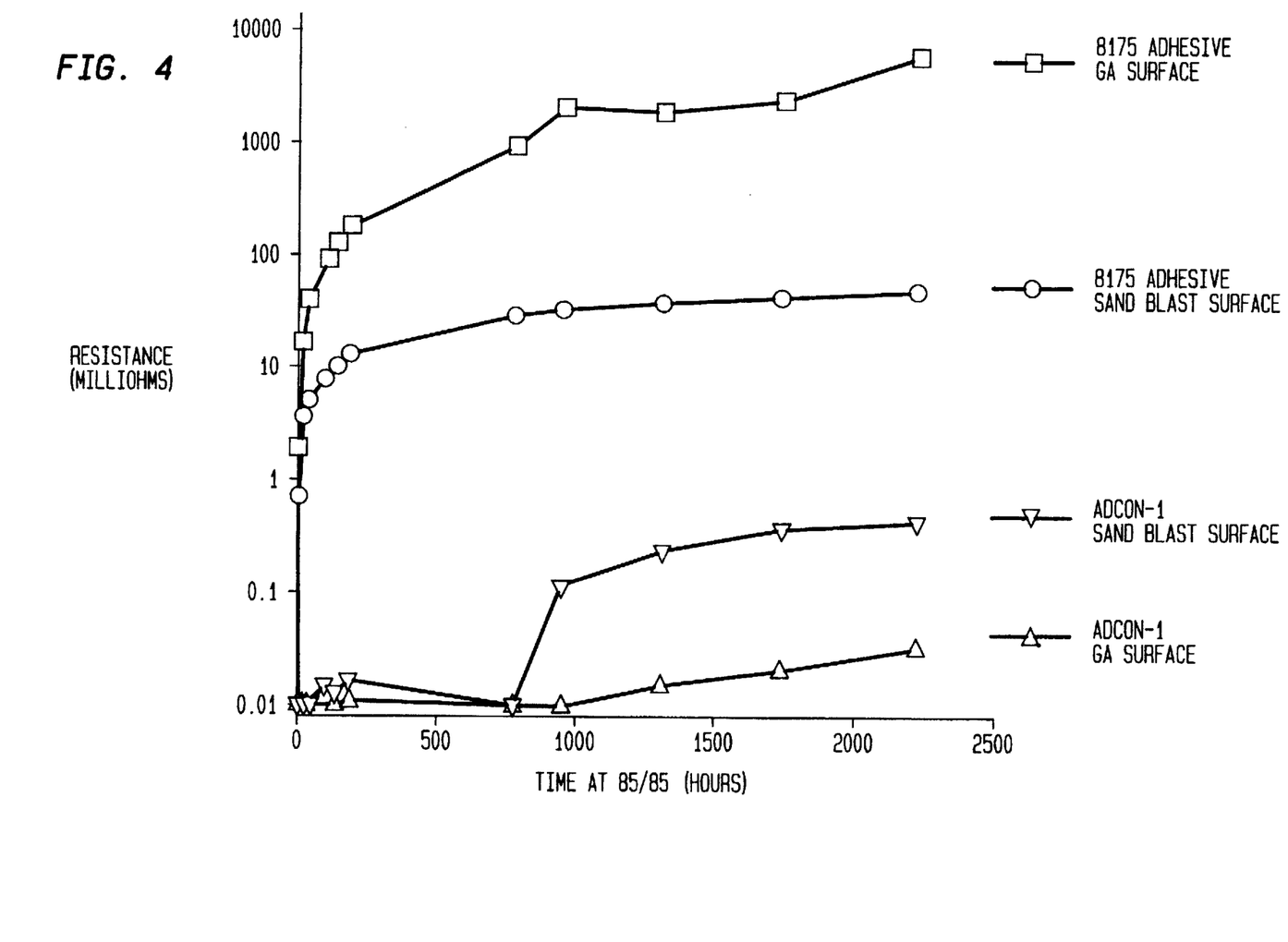
FIG. 4 shows a graph of joint resistance versus time for two different bonding joints formed by the present inventive method wherein each joint employs one of two different surface preparation techniques.

FIG. 4 illustrates the effect of the conductive adhesive on joint resistance for bonds formed according to the present invention. More specifically, FIG. 4 shows a graphical plot of joint resistance as a function of exposure to 85/85 test conditions for a bonding joint formed according to the present invention, wherein the surfaces are prepared by two different methods and the joints are formed with two different types of adhesives. The two types of adhesives are: (1) a commercially available silver flake filled epoxy (called Ablestick 8175), and (2) an adhesive having a composition prepared by the present applicants (hereinafter referred to as AdCon-1). AdCon-1 is 100 parts per hundred (phr) resin (Epiclon 830 diglycidyl ether of bisphenol F); 5 phr of thrixotropic agent (Cabosil TS-720); 10 phr of curing agent (2-ethyl,4-methylimidazole); and 77 wt. % conductive nickel particles (plated with copper and silver).

The two surface preparation methods are a GA etch and sand blasting. The sand blasting was accomplished using an aluminum grit propelled with 40 p.s.i. of air pressure. Whereas, the GA etch treatment process includes the following steps:

1. Immersing the conductive surface in hot 1,1,1 trichloroethane for 10 minutes.
2. Allowing the surface to cool for a few minutes in an empty clean beaker.
3. Placing the surface above boiling 1,1,1, trichloroethane for 5 minutes.
4. Allowing the surface to cool for 1–2 minutes.
5. Immersing the surface in hot NST solution, 50° C. for 20 minutes.
6. Transferring the surface to a beaker full of distilled water.
7. Rinsing the surface under flowing distilled water for 5 minutes.
8. Immersing the surface in hot, 70° C., sodium dichromate/ sulfuric acid solution for 20 minutes.
9. Immersing the surface in room temperature ferrous sulfate solution for 5 minutes with rapid stirring.
10. Transferring the surface to a beaker full of distilled water.
11. Rinsing the surface under flowing distilled water for 5 minutes.
12. Blow-drying the surface with house nitrogen, and
13. Drying the surface in oven at 100° C. for 5 minutes.

As shown, the AdCon-1 adhesive and assembly process resulted in significantly improved electrical contact stability over parts assembled with the Ablestick 8175 adhesive. Generally, this is due to the penetration of the plated nickel particles through the oxide layers to make contact with the underlying aluminum conductive surfaces. The increased penetration is due to several factors: (1) The plated nickel particles in the AdCon-1 are harder, larger and more spherical than the silver flake material in the Ablestick 8175; (2) The hard spherical particles focus the applied pressure onto a small region of contact at the surface-particle interface, whereas the silver flakes which have a high aspect ratio reduce the ability of the particles to penetrate the surface layer by spreading the applied pressure over a larger area; and (3) The larger particle sizes of the AdCon-1 adhesive increases the ability of the conductive particle to penetrate the aluminum surfaces at a given weight percent filler and applied pressure. This is due to the reduction in the total number of particles present, thus focusing the applied pressure on to fewer surface-particle interfaces.

When comparing the Ablestick 8175 joint resistance under the GA etch surface preparation treatment to the sandblasting treatment, another relationship is shown. Namely, when using the Ablestick 8175 adhesive, the joint resistance under the GA etch was greater than that of the sand blasting treatment. This is most likely due to the thicker oxide layer created by the GA etch surface preparation method. Thus, further proving that the oxide thickness has a direct effect on joint resistivity.

Note, however, that for the AdCon-1 samples, the GA etch resulted in lower joint resistance, after more than 750 hours at 85/85 conditions, than the sandblasting treatment. This shows that as the plated AdCon-1 particles are able to penetrate the oxide layers of both surfaces, the lower resistance of the GA etch may result from improved adhesion between the epoxy and the aluminum oxide surface.

Figure 5:
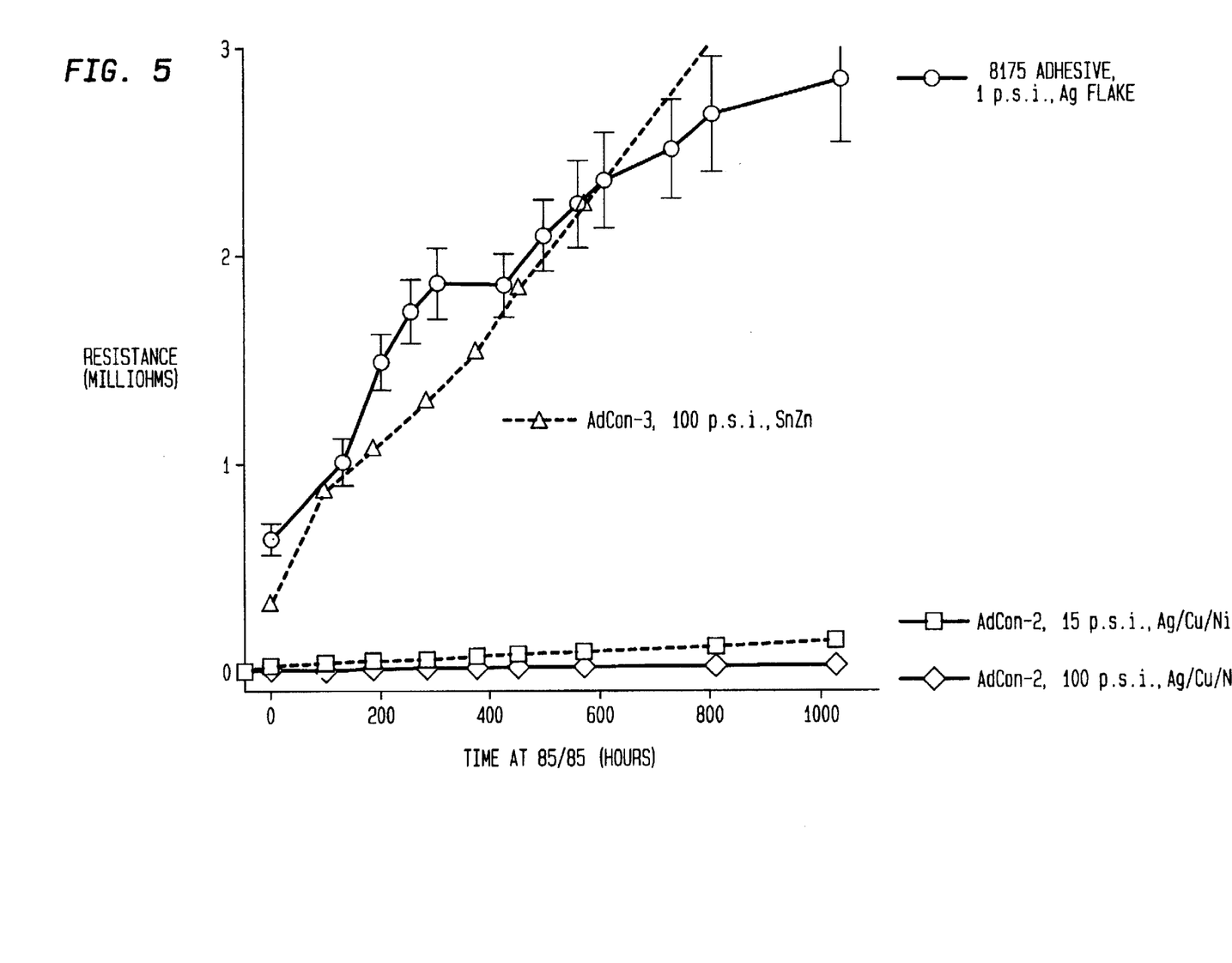
FIG. 5 illustrates the effect of the hardness of the conductive particles of the adhesive on the joint resistance when used in the present inventive bonding method.

FIG. 5 further illustrates why AdCon adhesives work better than Ablestick 8175 when bonding conductive surfaces upon which oxides form. More specifically, FIG. 5 shows the joint resistance of a bond formed with Ablestick 8175 as compared to the resistance of a bond formed with two other adhesives made by the inventors (hereinafter called AdCon-2 and AdCon-3). AdCon-2 has the same basic composition as AdCon-1 except that 25 phr of curing agent PN-23 and 66 wt % of the plated nickel particles were used. The composition of AdCon-3 has the same composition as AdCon-2 except that 52 wt % SnZn particles were added as conductive filler.

As shown, the AdCon-2 adhesive performs significantly better than Ablestick 8175 and AdCon-3, regardless of the pressure applied. Again, this is due to the hard particles of AdCon-2 piercing the oxide layers to make contact with the underlying metal. The softer particles of the silver flake-filled adhesive Ablestick 8175 and the SnZn particles of AdCon-3 are unable to pierce the oxide layer as well.

The effect of pressure is also demonstrated in FIG. 5. As shown, the AdCon-2 sample prepared at 100 p.s.i. performs better than the AdCon-2 sample at 15 p.s.i. The performance advantage is due to the increased number of particles penetrating the oxide layer to make contact with the conductive surface thereunder, at higher pressures. As discussed above, the more particles that penetrate the oxide layer, the lower the resistance of the bond.

Figure 6:
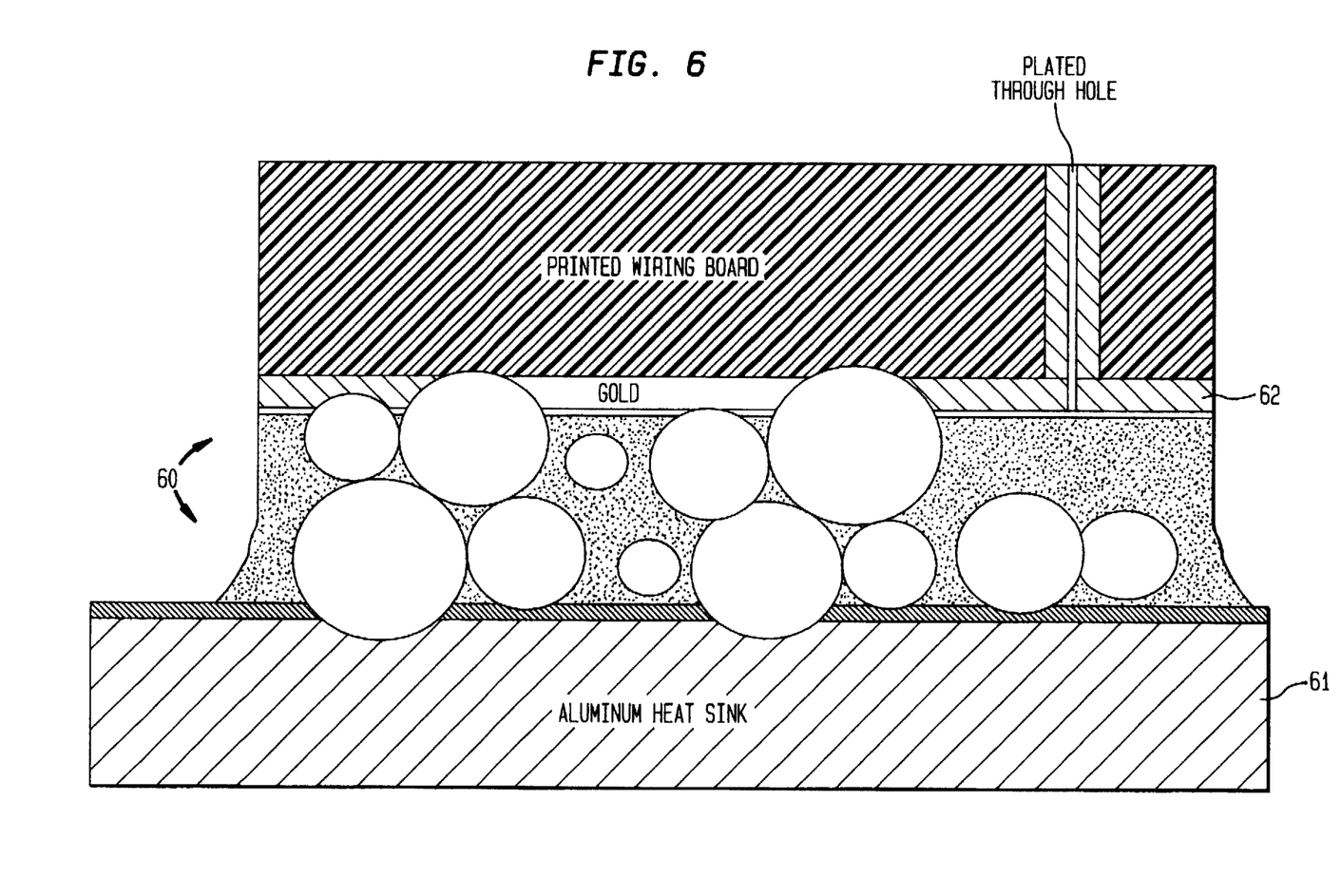
FIG. 6 shows a cross-sectional view of the bonding joint formed when an oxidizable conductive surface is bonded to a non-oxidizable bonding surface, gold, according to the method of the present invention.

An illustration of a joint formed between a conductive surface and a target surface on which oxides do not form is shown in FIG. 6. As shown, conductive surface 61 is bonded to a target surface 62 (e.g. gold, silver palladium, platinum) using conductive adhesive 60. Another example of a material on which oxides do not form is copper treated with an organic soldering preservative (OSP). The OSP is typically an imidazole. OSP's that inhibit the formation of oxides on copper surfaces are well known to those skilled in the art. It is clear that in such an embodiment of the present invention, the conductive particles of adhesive 60 do not have to penetrate an oxide layer to make contact with target surface 62. As a result, the surface preparation step for surface 62 does not involve the formation of an oxide layer, and the conductive adhesive only has to be as hard as the oxide formed on the conductive surface 61 as well as conductive surface 61 itself. Thus, the preparation of surface 62 only requires all dirt and grease to be cleaned therefrom.

What is claimed is:

1. A method of electrically and mechanically bonding a conductive surface made of a material on which unstable oxides form to a target surface using a conductive adhesive, the method comprising the steps of:

a. preparing the conductive surface so that a microscopically rough surface is formed to insure a substantially strong mechanical bond, said microscopically rough surface being coated with an oxide layer;

b. placing the conductive adhesive between said microscopically rough surface and the target surface to form a stack, the conductive adhesive having an amount of conductive particles that have a hardness at least as hard as said microscopically rough surface, said target surface and an underlying metal of said conductive surface, said amount insuring electrical conductivity between said underlying metal of said conductive surface and said target surface; and c. simultaneously applying heat and pressure to said stack to cure said conductive adhesive such that said conductive particles make contact with said target surface and pierce through said microscopically rough surface to make direct contact with said conductive surface thereunder.

2. The bonding method of claim 1 wherein the target surface is the type upon which stable oxides form, the method further comprising the step of preparing the target surface so that a substantially stable oxide is formed.

3. The method of claim 2 wherein said conductive particles are at least as hard as said hardness of said stable oxide.

4. The method of claim 3 wherein said simultaneous application of said heat and pressure forces said conductive particles through said stable oxide layer to make direct contact with the target surface thereunder.

5. The method of claim 1 wherein said conductive surface comprises a metal selected from the group consisting of aluminum, titanium, copper, steel, aluminum alloys, titanium alloys, copper alloys and steel alloys.

6. The method of claim 5 wherein the conductive surface is aluminum and wherein said microscopically rough surface comprises aluminum oxide.

7. The method of claim 6 wherein said step of preparing the conductive surface includes the step of etching the first conductive surface in a solution of $Na_2Cr_2O_7$—$H_2SO_4$.

8. The method of claim 1 wherein said preparation of the conductive surface in step a, includes the steps of mechanically roughening the first conductive surface thereby removing the oxide formed thereon, and allowing an oxide to naturally form on said roughened conductive surface.

9. The method of claim 8 wherein said roughening step further includes sandblasting the first conductive surface.

10. The method of claim 2 wherein said preparation of the target surface includes the step of cleaning said target surface.

11. The method of claim 10 wherein the target surface is a tin surface.

12. The method of claim 1 wherein said conductive adhesive has a composition including an epoxy resin, a curing agent and said conductive particles.

13. The method of claim 12 wherein said conductive particles are selected from the group consisting of silver plated nickel, silver plated glass, silver plated copper, pure silver, and pure nickel.

14. The method of claim 12 wherein the conductive adhesive is 5 to 30 volume percent said conductive particles.

15. The bonding method of claim 7 wherein the oxide thickness is about 40 nm.

16. The bonding method of claim 1 wherein the target surface is made of a material on which oxides do not form in an oxygen-containing atmosphere, the method further comprising the step of preparing the target surface to form a clean conductive surface thereon.

17. The bonding method of claim 16 wherein said step of simultaneously applying said heat and pressure forces said conductive particles in direct contact with said clean target surface.

18. The method of claim 16 wherein said target surface is composed of a material selected from the group consisting of gold, silver, palladium, platinum and OSP-treated copper.

19. The bonding method of claim 1 wherein the target surface is a material of the type upon which unstable oxides form, the method further comprising the step of preparing said unstable target surface so that a microscopically rough surface is coated with an oxide layer.

20. The method of claim 19 wherein said conductive particles are at least as hard as said hardness of said microscopically rough oxide surface on said target surface.

21. The method of claim 20 wherein said simultaneous application of said heat and pressure forces said conductive particles through said microscopically rough oxide surfaces to make direct contact with the material thereunder.

22. The method of claim 19 wherein said conductive surfaces comprise metals selected from the group consisting of aluminum, titanium, copper, steel, aluminum alloys, titanium alloys, copper alloys and steel alloys.

23. The method of claim 22 wherein the conductive surface is aluminum and wherein said microscopically rough surface thereon comprises aluminum oxide.

24. The method of claim 23 wherein said step of preparing the target and conductive surfaces includes the step of etching said oxidized surfaces in a solution of $Na_2Cr_2O_7$—$H_2SO_4$.

25. The method of claim 19 wherein said step of preparing said target and conductive surfaces includes the step of mechanically roughening the surfaces thereby removing the oxide formed thereon and allowing an oxide to naturally form on said roughened surfaces.

26. The method of claim 25 wherein the surfaces are mechanically roughened by sandblasting.

27. The method of claim 19 wherein said conductive adhesive has a composition including an epoxy resin, a curing agent and said conductive particles.

28. The method of claim 27 wherein said conductive particles are selected from the group consisting of silver plated nickel, silver plated glass, silver plated copper, pure silver, and pure nickel.

29. The method of claim 27 wherein the conductive adhesive is 5 to 30 volume percent said conductive particles.

30. The bonding method of claim 24 wherein the thickness of the microscopically rough oxide is about 40 nm.

31. The bonding method of claim 1 wherein said thickness of said oxide layer insures electrical conductivity between said target surface and said conductive surface after application of said pressure.

* * * * *